US008541943B2

(12) United States Patent
Zheng et al.

(10) Patent No.: US 8,541,943 B2
(45) Date of Patent: Sep. 24, 2013

(54) HIGHLY BRIGHT ELECTROLUMINESCENT WIRE

(75) Inventors: Yan Zheng, Shanghai (CN); Shufan Geng, Shanghai (CN); Jingyu Bian, Shanghai (CN)

(73) Assignee: Shanghai Kerun Phosphor Technology Co., Ltd., Shanghai (CN)

( * ) Notice: Subject to any disclaimer, the term of this patent is extended or adjusted under 35 U.S.C. 154(b) by 0 days.

(21) Appl. No.: 13/358,022

(22) Filed: Jan. 25, 2012

(65) Prior Publication Data

US 2013/0134868 A1 May 30, 2013

(30) Foreign Application Priority Data

Nov. 28, 2011 (CN) .......................... 2011 1 0385392

(51) Int. Cl.
*H01L 51/00* (2006.01)

(52) U.S. Cl.
USPC .......................................... 313/509; 313/512

(58) Field of Classification Search
USPC .................................................. 313/498–512
See application file for complete search history.

(56) References Cited

U.S. PATENT DOCUMENTS

| | | | | |
|---|---|---|---|---|
| 6,891,329 | B2 * | 5/2005 | Nagano et al. | 313/509 |
| 2007/0046192 | A1 * | 3/2007 | Akai et al. | 313/506 |
| 2008/0036375 | A1 * | 2/2008 | Zheng | 313/509 |

* cited by examiner

*Primary Examiner* — Anne Hines

(57) ABSTRACT

A highly bright electroluminescent wire includes a metal core electrode, an internal electron-emitting layer, an internal highly dielectric layer, a glowing layer, an external highly dielectric layer, an external electron-emitting layer, a transparent conductive layer, an electrode of external conductive layer, a transparent protective plastic layer and a color fluorescent transparent plastic layer orderly coated around the metal core electrode. The metal core electrode and the electrode of external conductive layer are charged with a voltage of AC50-400V and a frequency of 0.05 KHz to 20 KHz to produce a colored highly bright light.

4 Claims, 2 Drawing Sheets

HIGHLY BRIGHT ELECTROLUMINESCENT WIRE

BACKGROUND OF THE PRESENT INVENTION

1. Field of Invention

The present invention relates to an application of an electroluminescent device.

2. Description of Related Arts

An electroluminescent wire, also called a flexible neon wire, a cold light wire or an EL wire, is a new generation of product in the field of lighting display and illumination. The electroluminescent wire has a similar appearance with the common phone line and a surface of a color fluorescent PVC (polyvinyl chloride) plastic sleeving pipe. And the electroluminescent wire glows continuously without thermal radiation and has relatively low power consumption and features of being soft, foldable to be bent and easily knotted, cut and jointed. Thus it is widely used.

A conventional electroluminescent wire comprises a metal core electrode, an insulating medium layer, a glowing layer, a transparent conductive layer and a winding external electrode. The metal core electrode and the winding external electrode are charged to glow, whose structure, materials and ingredients are clearly disclosed in Chinese patents ZL01133342.1, 200680032428.8 and 200410099233.8. The single dielectric layer (also called an insulating layer or a medium layer), which is a simple art but has relatively low luminous intensity and insulativity and relatively less stability of the device, is adopted in the conventional arts. The poor brightness of the conventional electroluminescent wire is a main limitation in wide applications.

The present invention provides a highly bright electroluminescent wire through changing the structure of the conventional luminous wire and adding a structure of double layers, wherein the electron-emitting layer cooperates with the dielectric layer to greatly improve an efficiency of the dielectric layer, so as to improve luminous intensity and insulativity.

The highly bright electroluminescent wire can be widely applied in fields including advertisements, electronic devices, electric wires and clothing.

SUMMARY OF THE PRESENT INVENTION

The present invention provides a first highly bright electroluminescent wire comprising a metal core electrode, an internal electron-emitting layer, an internal highly dielectric layer, a glowing layer, an external highly dielectric layer, an external electron-emitting layer, a transparent conductive layer, an electrode of external conductive layer, a transparent protective plastic layer and a color fluorescent transparent plastic layer; the metal core electrode and the electrode of external conductive layer are charged with a voltage of AC50-400V and a frequency of 0.05 KHz to 20 KHz to produce colored highly bright lights. The external highly dielectric layer, the external electron-emitting layer and the transparent conductive layer are made of nanometer materials which become transparent or translucent after being dried as coatings.

The metal core electrode is made of well conductive copper wires or aluminum wires which have lustrous surfaces and can be nickel-plated, tin-plated or silver-plated.

The internal electron-emitting layer adopts a coating material having nano aluminum oxide or nano zinc oxide to greatly improve luminous intensity and a coating material substrate adhesive which can be epoxy resin or fluorine-contained resin, wherein the nano aluminum oxide or nano zinc oxide is added according to a weight ratio of 30% to 70%. The internal electron-emitting layer has a coating of 0.5 μm to 2 μm thick and is processed by temperature solidification or ultraviolet solidification. Materials fit for the internal electron-emitting layer of the present invention are required to be able to emit electrons under AC50-200V. Thus the internal electron-emitting layer can be made of aluminum silicate or magnesium oxide.

The internal highly dielectric layer adopts a coating material having copper calcium titanate and a coating material substrate adhesive which can be epoxy resin or fluorine-contained resin, wherein the copper calcium titanate is added according to a weight ratio of 30% to 70%. A granule of the copper calcium titanate has a diameter of 1 μm to 5 μm and a high dielectric constant and also produces a high dielectric constant under effects of the internal electron-emitting layer, so as to greatly contribute to improving the luminous intensity. The internal highly dielectric layer can be made of at least one coating material selected from the group consisting of barium titanate, lead titanate, strontium titanate and titanium dioxide, and mutually works with the internal electron-emitting layer so as to partially improve the luminous intensity. The internal highly dielectric layer has a coating around 10 μm thick and is processed by the temperature solidification or the ultraviolet solidification.

The glowing layer adopts an electroluminescent glowing material whose main ingredient is zinc sulfide mingled with copper and manganese, wherein the zinc sulfide mingled with copper glows a blue light, a bluish green light, or a green light; the zinc sulfide mingle with manganese glows an orange light or a yellow light. The glowing layer is made of a mixture of the glowing material and a coating material based on a weight ratio of 1 to 1 and adopts a coating material substrate adhesive, which can be epoxy resin or fluorine-contained resin. The glowing layer has a thickness of 30 μm to 50 μm and is processed by temperature solidification or ultraviolet solidification.

The external highly dielectric layer adopts a nanometer material having copper calcium titanate and the coating material substrate adhesive which can be epoxy resin or fluorine-contained resin, wherein the copper calcium titanate is added according to a weight ratio of 1% to 10%. The external highly dielectric layer, basically transparent, has a coating of 0.1 μm to 0.5 μm thick and is processed by temperature solidification or ultraviolet solidification. A coating material substrate thereof can be epoxy resin or fluorine-contained resin. The external highly dielectric layer also can be made of a mixture of at least one nanometer material selected from the group consisting of barium titanate, lead titanate, strontium titanate and titanium dioxide. The external highly dielectric layer is able to increase capacitance and the luminous intensity under effects of the external electron-emitting layer.

The external electron-emitting layer adopts a coating material having nano aluminum oxide or nano zinc oxide and a coating material substrate adhesive which can be epoxy resin or fluorine-contained resin, wherein the nano aluminum oxide or the nano zinc oxide is added according to a weight ratio of 1% to 15% and the nanometer material greatly contributes to improving the luminous intensity under a high voltage and a high frequency. The external electron-emitting layer, basically transparent, has a coating of 0.1 μm to 0.5 μm thick and is processed by temperature solidification or ultraviolet solidification. Materials fit for the external electron-emitting layer are required to be able to emit electrons under AC50-200V. Thus the external electron-emitting layer can also be made of aluminum silicate or magnesium oxide.

The transparent conductive layer is made of one conductive nanometer material selected from the group consisting of ITO, ATO and ZTO; ITO mainly comprises indium oxide and stannic oxide, ATO mainly comprises antimony oxide and stannic oxide, ZTO mainly comprises zinc oxide; the transparent conductive layer is coated on a surface of the external electron-emitting layer and has a thickness of 50 nm to 100 nm.

The electrode of external conductive layer adopts a well conductive copper wire or aluminum wire; a relatively short diameter thereof contributes to improving the luminous intensity. A plurality of the electrodes of external conductive layer is spare in case of being snapped.

The transparent protective plastic layer adopts an achromatic and transparent material selected from the group consisting of PVC, PE (polyethylene), PET (polyethylene terephthalate) and PU (polyurethane) and protects the transparent conductive layer 7 from being damaged by processing or using.

The color fluorescent transparent plastic layer adopts one material selected from the group consisting of PVC, PET and PU and having fluorescent dye added therein. A plurality of the fluorescent dyes of different colors produces colorful lights.

The metal core electrode and the electrode of external conductive layer are charged with a voltage of AC50-400V and a frequency of 0.05 KHz to 20 KHz to glow a colored highly bright light.

A second highly bright electroluminescent wire comprises a plurality of metal core electrodes, an internal electron-emitting layer, an internal highly dielectric layer, a glowing layer, an external highly dielectric layer, an external electron-emitting layer, a transparent conductive layer, a plurality of electrodes of external conductive layer, a transparent protective plastic layer and a color fluorescent transparent plastic layer.

The plurality of metal core electrodes respectively has an outer surface thereof coated with the internal electron-emitting layer and is arranged to wind and gyrate around an outer part of a central polyamide. The central polyamide has a surface thereof coated with a protective layer which keeps the central polyamide at a central position and a shape thereof. Further the internal highly dielectric layer, the glowing layer, the external highly dielectric layer, the external electron-emitting layer, the transparent conductive layer, the plurality of electrodes of external conductive layer, the transparent protective plastic layer and the color fluorescent transparent plastic layer are orderly coated on a surface of the plurality of metal core electrodes. A multiple controller is respectively connected to the plurality of metal core electrodes and the plurality of electrodes of external conductive layer and a charge of a voltage of AC50-400V and a frequency of 0.05 KHz to 20 KHz thereon produces a controllable dynamic colored highly bright light.

The plurality of metal core electrodes adopts well conductive copper wires or aluminum wires and respectively has a surface coated with the internal electron-emitting layer, wherein the metal core electrode is insulated with each other and able to work, either alone or in a group thereof, as an electrode. The internal electron-emitting layer adopts a coating material having nano aluminum oxide or nano zinc oxide; the internal highly dielectric layer adopts a coating material having copper calcium titanate; the glowing layer adopts an electroluminescent glowing material; the external highly dielectric layer adopts a nanometer coating material having the copper calcium titanate; the external electron-emitting layer adopts the coating material having the nano aluminum oxide or the nano zinc oxide; the transparent conductive layer adopts one conductive material selected from the group consisting of ITO, ATO and ZTO; the electrodes of external conductive layer are made of well conductive copper wires or aluminum wires; the transparent protective plastic layer adopts an achromatic and transparent material selected from the group consisting of PVC, PE, PET and PU; the color fluorescent transparent plastic layer adopts a material selected from the group consisting of PVC, PET and PU and having a fluorescent dye added therein.

Figure 1:
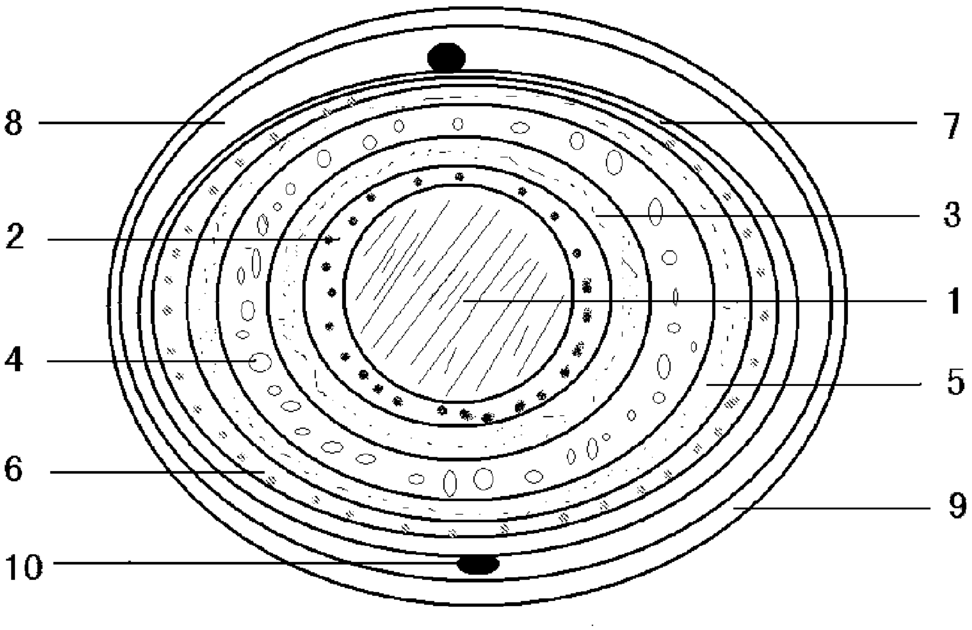
FIG. 1 is a sketch view of a structure of a highly bright electroluminescent wire according to a preferred embodiment of the present invention.
Figure 2:
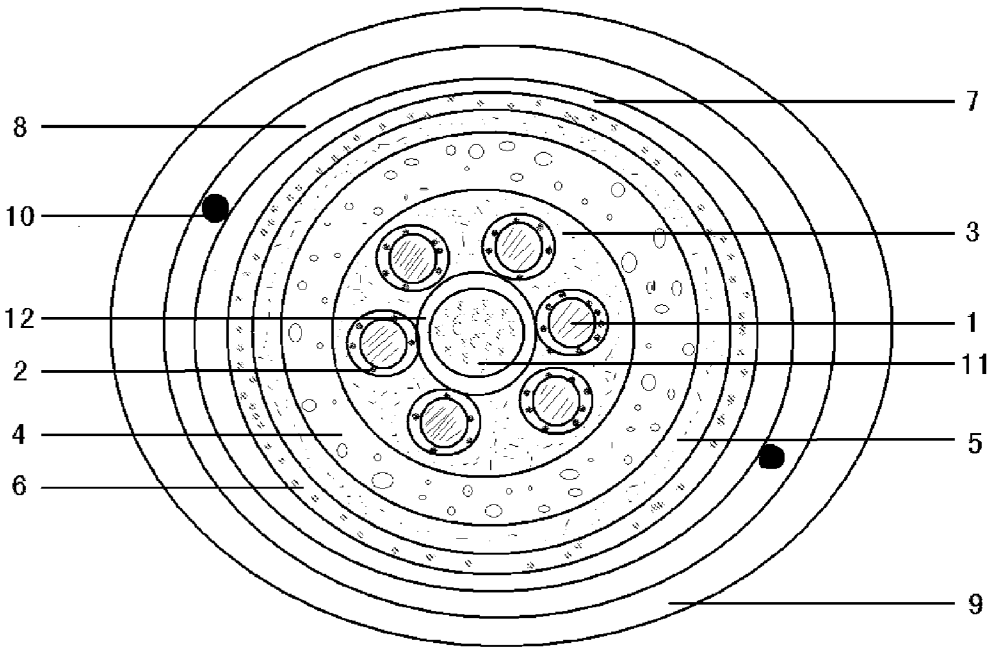
FIG. 2 is a sketch view of structures of a plurality of metal core wires according to another preferred embodiment of the present invention.

1—metal core electrode; 2—internal electron-emitting layer; 3—internal highly dielectric layer; 4—glowing layer; 5—external highly dielectric layer; 6—external electron-emitting layer; 7—transparent conductive layer; 8—transparent protective plastic layer; 9—color fluorescent transparent plastic layer; 10—electrode of external conductive layer; 11—central polyamide; 12—protective layer of central polyamide

DETAILED DESCRIPTION OF THE PREFERRED EMBODIMENT

A first highly bright electroluminescent wire comprises a metal core electrode 1, an internal electron-emitting layer 2, an internal highly dielectric layer 3, a glowing layer 4, an external highly dielectric layer 5, an external electron-emitting layer 6, a transparent conductive layer 7, an electrode of external conductive layer 10, a transparent protective plastic layer 8 and a color fluorescent transparent plastic layer 9, wherein the above layers are accomplished by plastic extruders and coating moulds.

The metal core electrode 1 adopts well conductive copper wires or aluminum wires; the metal core wire has a diameter of 0.1 mm to 1 mm and a lustrous surface without oily substance and plated with nickel, tin or silver to improve a reflectivity thereof.

The internal electron-emitting layer 2 adopts a coating material having nano aluminum oxide or nano zinc oxide and a coating material substrate adhesive which can be epoxy resin or fluro-contained resin, wherein the nano aluminum oxide or the nano zinc oxide is added according to a weight ratio of 30% to 70% and fully mingled. The internal electron-emitting layer 2 has a coating of 0.5 μm to 2 μm thick. A temperature of a temperature solidification of the epoxy resin or the fluorine-contained resin is controlled between 80 degrees and 150 degrees. A time of an ultraviolet solidification is controlled within 30 seconds. The internal electron-emitting layer 2 can also be made of aluminum silicate or magnesium oxide. A smooth surface of the internal electron-emitting layer 2 contributes to a fixed arrangement of a following coating.

The internal highly dielectric layer 3 adopts a coating material having copper calcium titanate and a coating material substrate adhesive which can be epoxy resin or fluorine-contained resin, wherein the copper calcium titanate is added according to a weight ratio of 30% to 70% and fully mingled. A granule of the copper calcium titanate has a diameter of 1 μm to 5 μm. The internal highly dielectric layer 3 has a coating around 10 μm thick and is processed by temperature solidification or ultraviolet solidification. At lease one coating material selected from the group consisting of barium titanate, lead titanate, strontium titanate and titanium dioxide are added in the copper calcium titanate. Thus the internal highly dielectric layer 3 adopts the coating material having the barium titanate, the lead titanate, the strontium titanate and the titanium dioxide and mutually works with the internal electron-emitting layer 2 to improve luminous intensity. A smooth surface of the internal highly dielectric layer 3 contributes to a fixed arrangement of a following coating.

The glowing layer 4 adopts an electroluminescent glowing material, such as D417B blue glowing material, D502S bluish green glowing material, D521C green glowing material and D585B orange glowing material. The glowing material is supposed to be dried before being used. Epoxy resin or fluorine-contained resin can be adopted as a coating material substrate adhesive thereof. The glowing material and a coating material are added according to a weight ratio of 1:1. The glowing layer has a thickness of 30 μm and 50 μm; a temperature of a temperature solidification of the epoxy resin or the fluorine-contained resin is controlled between 80 degrees and 150 degrees. A time of the ultraviolet solidification is controlled within 10 seconds since a long-time ultraviolet radiation is able to damage a service life of the glowing material.

The external highly dielectric layer 5 adopts a nanometer material having copper calcium titanate and a coating material substrate adhesive which can be epoxy resin or fluorine-contained resin, wherein the copper calcium titanate is added according to a weight ratio of 1% to 10%. The external highly dielectric layer 5, basically transparent, has a coating of 0.1 μm to 0.5 μm thick and is processed by temperature solidification or ultraviolet solidification. A coating material substrate can be epoxy resin or fluorine-contained resin. Using the nanometer material helps improve transparency and reduce light loss. The external highly dielectric layer 5 can adopt at least one nanometer material selected from the group consisting of barium titanate, lead titanate, strontium titanate and titanium dioxide.

The external electron-emitting layer 6 adopts a coating material having nano aluminum oxide or nano zinc oxide and a coating material substrate adhesive which can be epoxy resin or fluorine-contained resin, wherein the nano aluminum oxide or the nano zinc oxide is added according to a weight ratio of 1% to 15% and the nanometer material greatly contributes to improving brightness under a high voltage and a high frequency. The external electron-emitting layer 6, basically transparent, has a coating of 0.1 μm to 0.5 μm thick and is processed by temperature solidification or ultraviolet solidification. Materials fit for the internal electron-emitting layer 6 are required to be able to emit electrons under AC50-200V and thus the internal electron-emitting layer 6 can be made of aluminum silicate or magnesium oxide.

In a process of coating, an improvement in the transparency of the external highly dielectric layer 5 and the external electron-emitting layer 6 greatly contributes to the luminous intensity. The transparency thereof also depends on the ratio of adding the nanometer material. Reducing the ratio of adding the nanometer material is able to improve the transparency thereof; increasing the ratio of adding the nanometer material is able to improve an efficiency of an electric field. If the materials of nanometer granules are not adopted, the purpose of improving brightness is still achieved, while the transparency thereof is reduced and the luminous intensity is hindered, which leads to a limited improvement of the brightness of the present invention.

The transparent conductive layer 7 adopts one conductive nanometer material selected from the group consisting of ITO, ATO and ZTO; the ITO mainly comprises indium oxide and stannic oxide, the ATO mainly comprises antimony oxide and stannic oxide, the ZTO mainly comprises zinc oxide; the transparent conductive layer 7 is coated on a surface of the external electron-emitting layer 6 and has a thickness of 50 nm to 100 nm. A coating material substrate adhesive thereof can be epoxy resin or fluorine-contained resin.

The electrode of external conductive layer 10 adopts well conductive copper wires or aluminum wires; a relatively small diameter thereof contributes to improving the luminous intensity. A plurality of the electrodes of external conductive layer 10 is available in case of being snapped.

The transparent protective plastic layer 8 adopts one achromatic and transparent material selected from the group consisting of PVC, PE, PET and PU and protects the transparent conductive layer 7 from being damaged by processing or using.

The color fluorescent transparent plastic layer 9 adopts one material selected from the group consisting of PVC, PET and PU and having fluorescent dye added therein. A plurality of the fluorescent dyes of different colors produces colorful lights. A charge of a voltage of AC50-400V and a frequency of 0.05 KHz to 20 KHz on the metal core electrode 1 and the electrode of external conductive layer 10 produces a colored highly bright light.

A second highly bright electroluminescent wire comprises a plurality of metal core electrodes 1, an internal electron-emitting layer 2, an internal highly dielectric layer 3, a glowing layer 4, an external highly electric layer 5, an external electron-emitting layer 6, a transparent conductive layer 7, a plurality of electrodes of external conductive layer 10, a transparent protective plastic layer 8 and a color fluorescent transparent plastic layer 9.

Outer surfaces of the plurality of metal core electrodes 1 are respectively coated with the internal electron-emitting layer 2, such as 6, 8, 9, or 12 metal core wires. The plurality of metal core electrodes 1 is arrange to gyrate and wind around an outer part of a central polyamide 11 having a surface thereof coated with a protective layer 12; and then the internal highly dielectric layer 3, the glowing layer 4, the external highly dielectric layer 5, the external electron-emitting layer 6, the transparent conductive layer 7, the plurality of electrodes of external conductive layer 10, the transparent protective plastic layer 8 and the color fluorescent transparent plastic layer 9 are orderly coated on a surface of the plurality of metal core electrodes 1; the plurality of metal core electrodes 1 is arranged to gyrate and has the internal electron-emitting layer 2; a multiple controller is respectively connected to the plurality of metal core electrodes 1 and the plurality of the electrodes of external conductive layer 10 and a charge of a voltage of AC50-400V and a frequency of 0.05 KHz to 20 KHz thereon produces a controllable dynamic colored highly bright light.

Advantages of the present invention are following.

Firstly, by adopting the nanometer electron-emitting materials and the nanometer highly dielectric materials, the present invention efficiently improves the brightness of the electroluminescent wire more than 70% so as to broaden an application range of the electroluminescent wire.

Secondly, by adding the electron-emitting layer and the highly dielectric layer, based on conventional arts, a feature of resisting high pressure of the electroluminescent wire is further greatly improved.

Thirdly, a structure of the multiple layers is applied to the plurality of metal core wires and effects of spot following and rolling of the highly bright electroluminescent wire are accomplished through an adjustment of the controller.

The electroluminescent wire of the present invention is able to move, to glow gradually and to resist a high pressure and thus can be applied in fields including advertisements, models, clothing, decorations of buildings, safe guiding and lighting. The present invention is a simple art and fit for mass production.

A Preferred Embodiment

A highly bright electroluminescent wire has a metal core electrode made of well conductive nickel-plated copper wire, wherein the metal core wire has a diameter of 0.5 mm and a lustrous surface without oily substance.

An internal electron-emitting layer thereof adopts an epoxy resin coating material having 50% of nano aluminum oxide fully mingle therein, wherein a coating is 0.5 μm thick and dried at 110 degrees.

An internal highly dielectric layer thereof adopts an epoxy resin coating material having 60% of copper calcium titanate, wherein a coating is 7 μm thick and dried at 110 degree.

A glowing layer thereof adopts a D521C green electroluminescent glowing material which is mingled with an epoxy resin coating material according to a weight ratio of 1:1. The glowing layer thereof is 0.1 μm thick and solidified at 110 degrees.

An external highly dielectric layer thereof adopts a nanometer material having copper calcium titanate; according to a weight ratio, 5% of the copper calcium titanate is added into an epoxy resin coating material, wherein a coating is 0.1 μm thick and dried at 110 degrees.

An external electron-emitting layer thereof adopts a coating material having nano zinc oxide; a coating material substrate of the external electron-emitting layer is epoxy resin, wherein according to a weight ratio 10% of nano zinc oxide is added. The external electron-emitting layer, basically transparent, has a coating of 0.3 μm and is dried at 110 degrees.

A transparent conductive layer thereof adopts a conductive nano ITO; the transparent conductive layer is coated on a surface of the external electron-emitting layer and has a thickness of 50 nm.

An electrode of external conductive layer thereof adopts two well conductive copper wires; a diameter of the copper wire is 0.1 mm.

A transparent protective plastic layer thereof adopts achromatic and transparent PVC.

A charge of a voltage of AC50-400V and a frequency of 0.05 KHz to 20 KHz on the metal core electrode and the electrode of external conductive layer produces a red highly bright light.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A highly bright electroluminescent wire, comprising a metal core electrode, wherein an internal electron-emitting layer, an internal highly dielectric layer, a glowing layer, an external highly dielectric layer, an external electron-emitting layer, a transparent conductive layer, an external electrode formed of a conductive layer, a transparent protective plastic layer and a color fluorescent transparent plastic layer are coated in order around said metal core electrode; said metal core electrode and said external electrode formed of said conductive layer are charged with a voltage of AC50-400V and a frequency of 0.05 KHz to 20 KHz, wherein said internal electron-emitting layer, said internal highly dielectric layer, said glowing layer, said external highly electric layer, said external electron-emitting layer, said transparent conductive layer interoperate to provide a high electric field, in such a manner that said glowing layer produces a colored highly bright light.

2. The highly bright electroluminescent wire, as recited in claim 1, wherein said metal core electrode adopts well conductive copper wires or aluminum wires; said internal electron-emitting layer adopts a coating material having nano aluminum oxide or nano zinc oxide; said internal highly dielectric layer adopts a coating material having copper calcium titanate; said glowing layer adopts an electroluminescent glowing material; said external highly dielectric layer adopts a coating material having copper calcium titanate; said external electron-emitting layer adopts a coating material having nano aluminum oxide or nano zinc oxide; said transparent conductive layer adopts one conductive nanometer material selected from the group consisting of ITO, ATO and ZTO; said external electrode formed of said conductive layer adopts well conductive copper wires or aluminum wires; said transparent protective plastic layer adopts one achromatic and transparent material selected from the group consisting of PVC, PE, PET and PU; said color fluorescent transparent plastic layer adopt one plastic material selected from the group consisting of PVC, PET and PU and having fluorescent dye added therein.

3. A highly bright electroluminescent wire, comprising a plurality of metal core electrodes, an internal electron-emitting layer, an internal highly dielectric layer, a glowing layer, an external highly dielectric layer, an external electron-emitting layer, a transparent conductive layer, a plurality of external electrodes formed of conductive layers, a transparent protective plastic layer and a color fluorescent transparent plastic layer, wherein said plurality of metal core electrode has outer surfaces thereof respectively coated with said internal electron-emitting layer and is arranged to gyrate and wind around an outer part of a central polyamide; said internal highly dielectric layer, said glowing layer, said external highly dielectric layer, said external electron-emitting layer, said transparent conductive layer, said plurality of external electrodes formed of said conductive layers, said transparent protective plastic layer and said color fluorescent transparent plastic layer are coated in order around said plurality of metal core electrodes; a multiple controller is respectively connected to said plurality of metal core electrodes and said plurality of external electrodes of said conductive layers and a charge of a voltage of AC50-400V and a frequency of 0.05 KHz to 20 KHz thereon is able to produce a controllable dynamic colored highly bright light.

4. The highly bright electroluminescent wire, as recited in claim 3, wherein said plurality of metal core electrodes adopt well conductive copper wires or aluminum wires; said internal electron-emitting layer adopts a coating material having nano aluminum oxide or nano zinc oxide; said internal highly dielectric layer adopts a coating material having copper calcium titanate; said glowing layer adopts an electroluminescent glowing material; said external highly dielectric layer adopts a nanometer coating material having copper calcium titanate; said external electron-emitting layer adopts a coating material having nano aluminum oxide or nano zinc oxide; said transparent conductive layer adopts one conductive nanometer material selected from the group consisting of ITO, ATO and ZTO; said external electrode formed of said conductive layer adopts well conductive copper wires or aluminum wires; said transparent protective plastic layer adopts one achromatic and transparent material selected from the group consisting of PVC, PE, PET and PU; said color fluorescent transparent plastic layer adopts one plastic material selected from the group consisting of PVC, PET and PU and having fluorescent dye added therein.

* * * * *